United States Patent
Nguyen et al.

(10) Patent No.: US 10,672,591 B2
(45) Date of Patent: Jun. 2, 2020

(54) APPARATUS FOR REMOVING PARTICLES FROM A TWIN CHAMBER PROCESSING SYSTEM (71) Applicant: APPLIED MATERIALS, INC., Santa Clara, CA (US)

(72) Inventors: Andrew Nguyen, San Jose, CA (US); Tom K. Cho, Los Altos, CA (US); Kartik Ramaswamy, San Jose, CA (US); Yogananda Sarode Vishwanath, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 778 days.

(21) Appl. No.: 13/962,575

(22) Filed: Aug. 8, 2013

(65) Prior Publication Data
US 2014/0374024 A1 Dec. 25, 2014

Related U.S. Application Data (60) Provisional application No. 61/837,911, filed on Jun. 21, 2013.

(51) Int. Cl.
H01J 37/32 (2006.01)
H01L 21/67 (2006.01)
C23C 16/44 (2006.01)
C23C 16/455 (2006.01)
(Continued)

(52) U.S. Cl.
CPC .... *H01J 37/32357* (2013.01); *C23C 16/4405* (2013.01); *C23C 16/4412* (2013.01); *C23C 16/455* (2013.01); *C23C 16/48* (2013.01);
*H01J 37/32834* (2013.01); *H01J 37/32899* (2013.01); *H01L 21/6719* (2013.01);
(Continued)

(58) Field of Classification Search
None
See application file for complete search history.

(56) References Cited

U.S. PATENT DOCUMENTS 5,639,309 A * 6/1997 Akimoto ........... H01J 37/32192
118/723 E
6,736,147 B2 5/2004 Satoh et al.
(Continued)

FOREIGN PATENT DOCUMENTS

JP 2011-243635 A 12/2011
KR 10-2011-0067205 A 6/2011

OTHER PUBLICATIONS

International Search Report and Written Opinion dated Sep. 30, 2014 for PCT Application No. PCT/US2014/041024.

*Primary Examiner* — Karla A Moore
(74) *Attorney, Agent, or Firm* — Moser Taboada; Alan Taboada (57) ABSTRACT Embodiments of an apparatus for removing particles from a twin chamber processing system are provided herein. In some embodiments, an apparatus for removing particles from a twin chamber processing system includes a remote plasma system; and a plurality of conduits fluidly coupling the remote plasma system to each process chamber of a twin chamber processing system to provide a plasma to an exhaust volume of each process chamber, wherein each conduit of the plurality of conduits has an outlet disposed along a boundary of the respective exhaust volumes.

12 Claims, 7 Drawing Sheets (51) Int. Cl.
*C23C 16/48* (2006.01)
*B08B 7/00* (2006.01)
(52) U.S. Cl.
CPC .......... *H01L 21/67069* (2013.01); *B08B 7/00* (2013.01); *B08B 7/0035* (2013.01)

(56) References Cited

U.S. PATENT DOCUMENTS

| | | | | |
|---|---|---|---|---|
| 2004/0200499 | A1* | 10/2004 | Harvey | B08B 7/0035 |
| | | | | 134/1.1 |
| 2009/0028761 | A1* | 1/2009 | Devine | H01L 21/67069 |
| | | | | 422/186.04 |
| 2009/0035945 | A1 | 2/2009 | Fujii et al. | |
| 2009/0314309 | A1* | 12/2009 | Sankarakrishnan | B08B 5/00 |
| | | | | 134/1.1 |
| 2011/0266256 | A1* | 11/2011 | Cruse | H01J 37/32899 |
| | | | | 216/59 |
| 2012/0304930 | A1 | 12/2012 | Verdict et al. | |
| 2013/0133697 | A1* | 5/2013 | Stockman | B08B 17/02 |
| | | | | 134/22.1 |

* cited by examiner

APPARATUS FOR REMOVING PARTICLES FROM A TWIN CHAMBER PROCESSING SYSTEM

CROSS-REFERENCE TO RELATED APPLICATIONS

This application claims benefit of U.S. provisional patent application Ser. No. 61/837,911, filed Jun. 21, 2013, which is herein incorporated by reference.

FIELD

Embodiments of the present invention generally relate to substrate processing equipment.

BACKGROUND

Conventional semiconductor fabrication process chambers typically contain a number of mechanical components to facilitate performing process within the process chamber, for example, such as lift-pins, slit valve doors, throttle gate valves, or the like. However, the inventors have observed that due to the mechanical contact of such components, particles (e.g., particles containing silicon, oxygen, aluminum, or the like) may be created that may settle within the process chamber and/or substrate, thereby having a detrimental effect on subsequent processes performed within the process chamber.

Therefore, the inventors have provided an improved apparatus for removing particles from a twin chamber processing system.

SUMMARY

Embodiments of an apparatus for removing particles from a twin chamber processing system are provided herein. In some embodiments, an apparatus for removing particles from a twin chamber processing system includes a remote plasma system; and a plurality of conduits fluidly coupling the remote plasma system to each process chamber of a twin chamber processing system to provide a plasma to an exhaust volume of each process chamber, wherein each conduit of the plurality of conduits has an outlet disposed along a boundary of the respective exhaust volumes.

In some embodiments, a twin chamber processing system includes a transfer chamber; two process chambers coupled to the transfer chamber, the two process chambers having one or more shared resources; a remote plasma system coupled to each of the two process chambers; and a plurality of conduits fluidly coupling the remote plasma system to each of the two process chambers to provide a plasma to an exhaust volume of each of the two process chambers, wherein each conduit of the plurality of conduits has an outlet disposed along a boundary of the respective exhaust volumes.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide an apparatus for removing particles from a twin chamber processing system. The inventive apparatus may advantageously facilitate removal of particles from a process chamber caused by, for example, mechanical contact of process chamber components, such as slit valves, throttle valves, lift pins, or the like.

Figure 1:
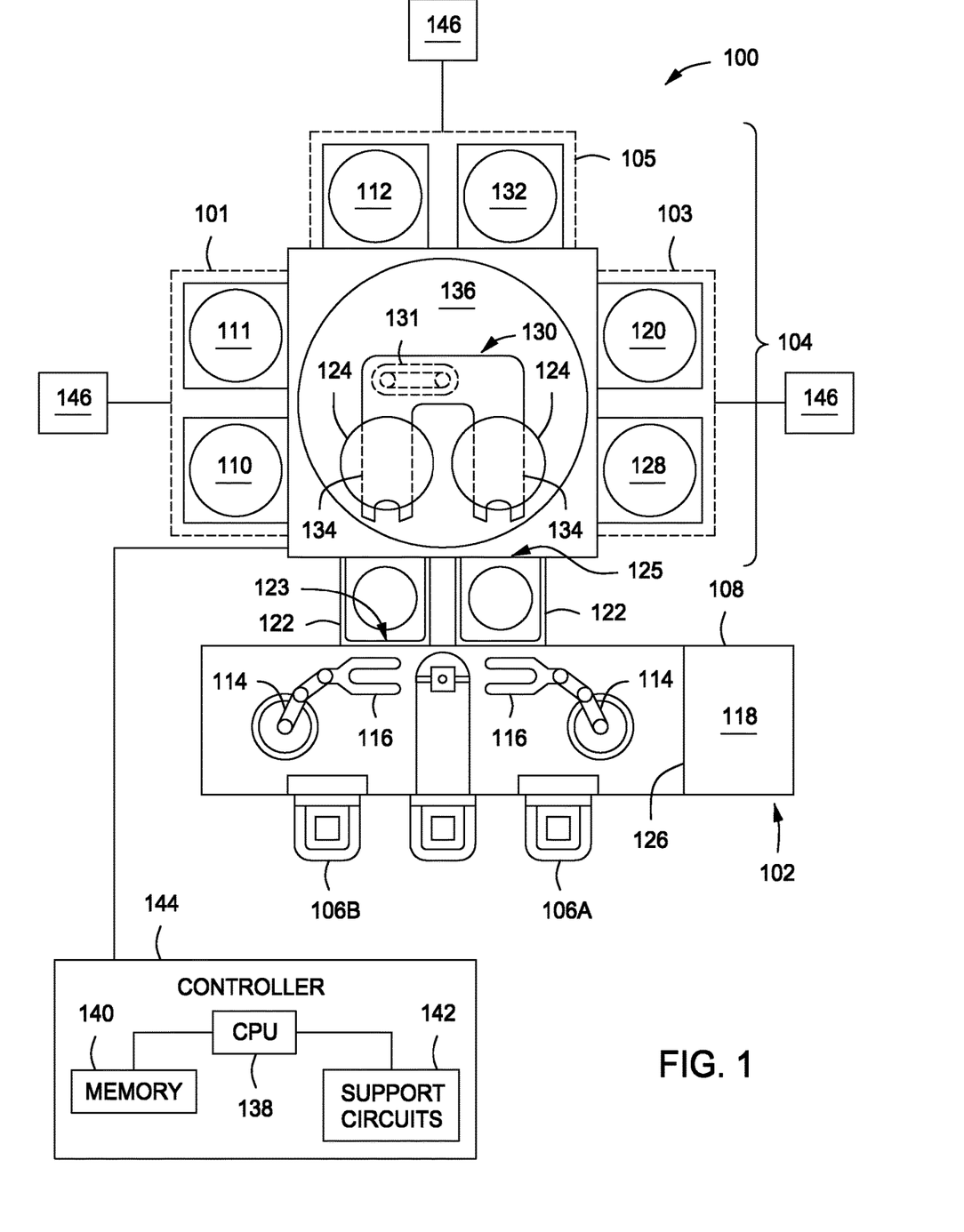
FIG. 1 depicts an exemplary processing system having an apparatus for removing particles from a twin chamber processing system in accordance with some embodiments of the present invention.

FIG. 1 depicts an exemplary processing system suitable for use with an apparatus for removing particles from a twin chamber processing system in accordance with some embodiments of the present invention. In some embodiments, the processing system 100 may generally comprise a vacuum-tight processing platform (processing platform 104), a factory interface 102, and a system controller 144. Examples of processing systems that may be suitably modified in accordance with the teachings provided herein include the CENTURA® integrated processing system, one of the PRODUCER® line of processing systems (such as the PRODUCER® GT™), one of the CENTRIS™ line of processing systems, or other suitable processing systems commercially available from Applied Materials, Inc., located in Santa Clara, Calif. It is contemplated that other processing systems (including those from other manufacturers) may be adapted to benefit from the invention.

The processing platform 104 may include a plurality of processing chambers (six process chambers 110, 111, 112, 132, 128, 120 shown) and at least one load-lock chamber (two load lock chambers 122 shown) that are coupled to a transfer chamber 136. Each process chamber includes a slit valve or other selectively sealable opening to selectively fluidly couple the respective inner volumes of the process chambers to the inner volume of the transfer chamber 136. In some embodiments, each of the load lock chambers 122 may comprise a first port 123 coupled to the factory interface 102 and a second port 125 coupled to the transfer chamber 136. The load lock chambers 122 may be coupled to a pressure control system which pumps down and vents the load lock chambers 122 to facilitate passing the substrate between the vacuum environment of the transfer chamber 136 and the substantially ambient (e.g., atmospheric) environment of the factory interface 102. The factory interface 102 is coupled to the transfer chamber 136 via the load lock chambers 122.

The processing chambers 110, 111, 112, 132, 128, 120 may be any type of process chamber utilized in substrate processing. In some embodiments, at least one of the processing chambers 110, 111, 112, 132, 128, 120 may be an etch chamber, deposition chamber, or the like. For example, in embodiments where at least one of the processing chambers 110, 111, 112, 132, 128, 120 is an etch chamber, the at least one of the processing chamber 110, 111, 112, 132, 128, 120 may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, or in combination, in some embodiments, at least one of the process chambers 110, 111, 112, 132, 128, 120 may be one of a HART™, E-MAX®, DPS®, DPS II, or ENABLER® etch chamber also available from Applied Materials, Inc. In some embodiments, one or more of the process chambers 110, 111, 112, 132, 128, 120 may be similar to the process chambers described below. Other etch chambers, including those from other manufacturers, may be utilized.

In some embodiments, for example, as depicted in FIG. 1, the processing chambers 110, 111, 112, 132, 128, 120 may be grouped in pairs (e.g., two process chambers) with each of the processing chambers 110, 111, 112, 132, 128, 120 in each pair positioned adjacent to one another. In some embodiments, each pair of process chambers may be part of a twin chamber processing system (101, 103, 105) where each respective pair of process chambers may be provided in a common housing with certain shared resources provided, as discussed herein. Each twin chamber processing system 101, 103, 105 may include a pair of independent processing volumes that may be isolated from each other. For example, each twin chamber processing system may include a first process chamber and a second process chamber, having respective first and second processing volumes. The first and second processing volumes may be isolated from each other to facilitate substantially independent processing of substrates in each respective process chamber. The isolated processing volumes of the process chambers within the twin chamber processing system advantageously reduces or eliminates processing problems that may arise due to multi-substrate processing systems where the processing volumes are fluidly coupled during processing.

In addition, the twin chamber processing system further advantageously utilizes shared resources that facilitate reduced system footprint, hardware expense, utilities usage and cost, maintenance, and the like, while at the same time promoting higher substrate throughput. For example, as shown in FIG. 1, the processing chambers may be configured such that certain processing resources (e.g., process gas supply, power supply, or the like) may be shared between each of the process chambers 110, 111, 112, 132, 128, 120 or within each pair of process chambers within that respective pair. Other examples of shared hardware and/or resources may include one or more of a process foreline and roughing pump, AC distribution and DC power supplies, cooling water distribution, chillers, multi-channel thermo controllers, gas panels, controllers, and the like.

The inventors have observed that, in twin chamber processing systems (e.g., the processing system 100 shown in FIG. 1), the operation of various mechanical process chamber components (e.g., lift-pins, slit valve doors, throttle gate valves, or the like) may cause the formation of particles within the process chambers (e.g., process chambers 110, 111, 112, 132, 128, 120 shown in FIG. 1). The particles may be a result of, for example, deposited materials (e.g., deposition material utilized in substrate deposition processes, etch residues, process byproducts, or the like) flaking off the process chamber components, material that is used to fabricate the process chamber components being mechanically removed from the component due to friction between the components, or the like. For example, in some embodiments, the particles may contain silicon (Si), oxygen (O), aluminum (Al), combinations thereof, or the like.

The inventors have further observed that the particles formed may settle on other process chamber components and/or a substrate disposed within the process chamber, thereby having a detrimental effect on subsequent processes performed within the process chamber. In particular, the inventors have observed that, as fabrication techniques evolve to produce smaller device and/or feature sizes, tolerance for an amount and/or size of particles present in the process chamber decreases. For example, a previously permissible amount and/or size of particles that could be present in a process chamber without having an effect on substrate fabrication may no longer be permissible and require removal.

As such, in some embodiments, one or more remote plasma systems (three remote plasma systems 146 shown) may be coupled to the process chambers 110, 111, 112, 132, 128, 120 of the processing system 100 to facilitate the removal of the particles from the process chambers 110, 111, 112, 132, 128, 120, such as shown in FIG. 1. By coupling one or more remote plasma systems to the processing system 100 a plasma may be provided to the process chamber to remove the particles and/or reduce the particle size, thereby allowing the particles to be removed from the process chamber via, for example, a vacuum pump. Without being bound by theory, the inventors believe that by exposing the particles to the plasma, radicals formed in the plasma may energetically bombard the particles, thereby facilitating a mechanical removal of the particles, which may then be evacuated from the process chamber via, for example, a vacuum pump. The plasma formed by the remote plasma system 146 may be any type of plasma suitable to facilitate removal of the particles and may be dependent on the composition of the particles.

The one or more remote plasma systems 146 may be of any type or configuration suitable to form and provide a plasma to the process chambers 110, 111, 112, 132, 128, 120 to facilitate removal of particles from the process chambers 110, 111, 112, 132, 128, 120 as described herein. For example, in some embodiments, each of the remote plasma systems 146 may generally comprise a chamber having an inner volume, a process gas supply to provide a process gas to the inner volume of the chamber, and a power source to provide power to the chamber to ignite the process gas to form the plasma. The power source may be any type of power source, for example, such as an RF power source. In some embodiments, the power source may provide power to an inductive coil (e.g., antenna) disposed proximate or within the process chamber. When present the inductive coil facilitates coupling power from the power supply to the process gas to form the plasma. The process gas supply may provide any process gas suitable to form a desired plasma to facilitate removal of particles from the process chambers 110, 111, 112, 132, 128, 120 and may be dependent on the type or size of the process chamber and/or the composition of the particles that are to be removed. For example, the process gas be may comprise one or more of a hydrogen containing gas such as hydrogen bromide (HBr), methane ($CH_4$), or the like, other gases such as oxygen (O2), argon (Ar), helium (He), chlorine ($Cl_2$), or the like, and combinations thereof.

Although three remote plasma systems 146 are shown, other numbers of remote plasma systems may be utilized and may be dependent on a number and/or configuration of the process chambers 110, 111, 112, 132, 128, 120 of the processing system 100. For example, in some embodiments, each process chamber 110, 111, 112, 132, 128, 120 may have a remote plasma source coupled to the process chamber 110, 111, 112, 132, 128, 120. Alternatively, in some embodiments, each of the remote plasma systems 146 may be coupled to two or more process chambers 110, 111, 112, 132, 128, 120. For example, in some embodiments, one remote plasma system 146 may be coupled to each twin chamber processing system 101, 103, 105, such as shown in FIG. 1. In such embodiments, the remote plasma system 146 may function as a shared resource between two adjacent process chambers 110, 111, 112, 132, 128, 120 of each twin chamber processing system 101, 103, 105, thereby reducing an overall footprint and cost of the processing system 100.

The remote plasma system 146 may be coupled to the process chamber 110, 111, 112, 132, 128, 120 in any location about the process chamber suitable to facilitate the removal of the particles and may be dependent on the process chamber configuration (e.g., the location of the process chamber components), for example, such as described below with respect to FIGS. 2-8.

Figure 2:
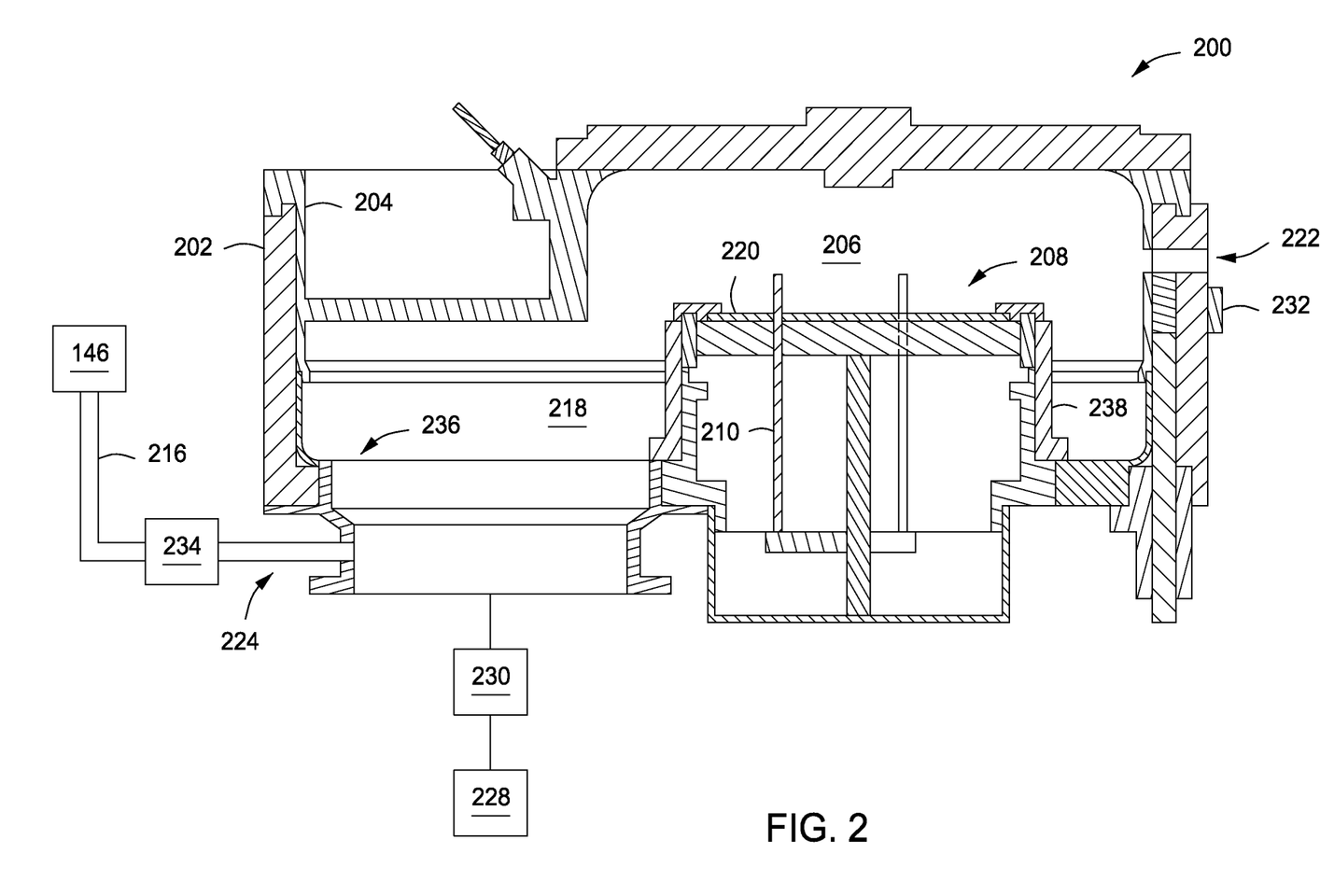
FIG. 2 depicts an apparatus for removing particles from a twin chamber processing system coupled to a process chamber in accordance with some embodiments of the present invention.

For example, referring to FIG. 2, each of the process chambers 200 may generally include a chamber body 202 having a processing volume 206, an exhaust volume 218 and an upper liner 204 disposed within the chamber body 202. When present, the upper liner 204 may define the processing volume 206 and the exhaust volume 218, for example, such as shown in FIG. 2. A substrate support 208 having a housing 238 and a substrate supporting surface 220 may be disposed within the processing volume 206. A plurality of lift pins 210 may be movably disposed through the substrate supporting surface 220 to facilitate selectively lifting and lowering a substrate. An opening 222 that is selectively sealed via a slit valve 232 may be formed in the chamber body 202 to facilitate providing and removing substrates from the process chamber 200. A spool 224 may be coupled to an exhaust port 236 of the process chamber 200 to allow a vacuum pump 228 to be coupled to the exhaust volume 218 to facilitate evacuating the process chamber 200. A throttle gate valve 230 may be coupled to the vacuum pump 228.

In some embodiments the remote plasma system 146 may be coupled to the process chamber 200 along a boundary of an exhaust volume of the process chamber 200 in such a manner that the remote plasma system 146 provides a plasma to an area within or proximate the exhaust volume 218 of the process chamber 200, for example, such as shown in FIG. 2. Coupling the remote plasma system 146 to the process chamber in such a manner may facilitate the removal of particles formed, at least in part, from the mechanical actuation of a throttle gate valve 230 coupled to the vacuum pump 228. The inventors have observed that in conventionally configured process chambers having an exhaust port (e.g., the process chamber 200 shown in FIG. 2), the above described particles typically settle and accumulate proximate the exhaust port. As such, coupling the remote plasma system 146 to the process chamber 200 in such a manner that the remote plasma system 146 provides a plasma to an area within or proximate an exhaust volume 218 may advantageously be more effective to remove the particles from the areas where the particles accumulate (e.g., the exhaust) while not unnecessarily exposing other areas of the processing volume to the plasma.

In such embodiments, the remote plasma system 146 may be coupled to the spool 224 of the process chamber 200 via a conduit 216 having an outlet disposed in the spool 224 (e.g., along a boundary of the exhaust volume). In such embodiments, the remote plasma system 146 may provide the plasma proximate the exhaust port 236. A valve 234 may be coupled to the conduit 216 to selectively allow the plasma formed in the remote plasma system 146 to flow to the spool 224.

Figure 3:
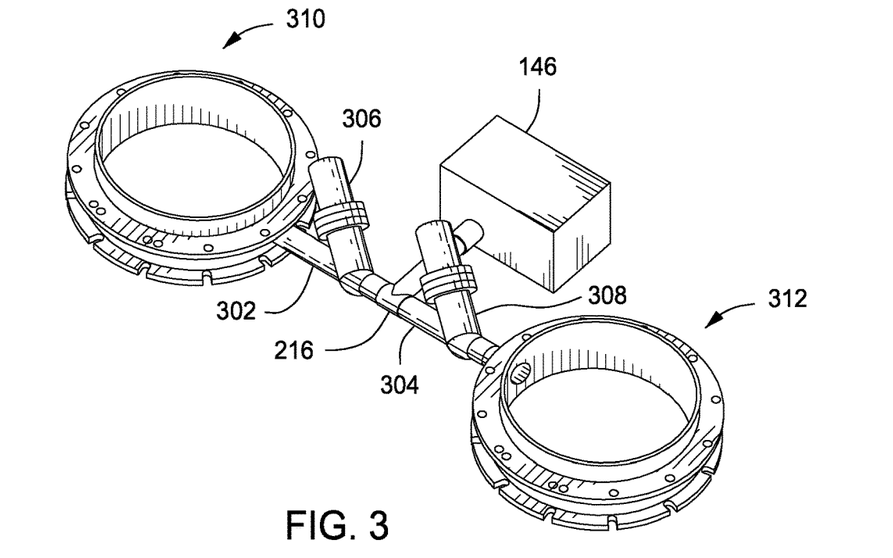
FIG. 3 depicts an apparatus for removing particles from a twin chamber processing system coupled to a component of a process chamber in accordance with some embodiments of the present invention.

Referring to FIG. 3, in some embodiments, for example where a single remote plasma system, (e.g., remote plasma system 146) is shared between two process chambers, the conduit 216 (e.g., a first conduit) may be fluidly coupled to two separate second conduits 302, 304 to fluidly couple the conduit 216 to each process chamber of the twin chamber processing system, thereby allowing the plasma to be provided to each process chamber via two or more spools (two spools 310, 312 shown). In such embodiments, a valve 306, 308 (e.g., a pneumatic straight through valve) may be coupled to each of the separate conduits 302, 304 to allow the plasma to be selectively provided to the spools 310, 312. In some embodiments, each of the separate second conduits 302, 304 may have substantially similar dimensions to provide an equal flow conductance through the second conduits 302, 304 to each of the spools 310, 312.

Figure 4:
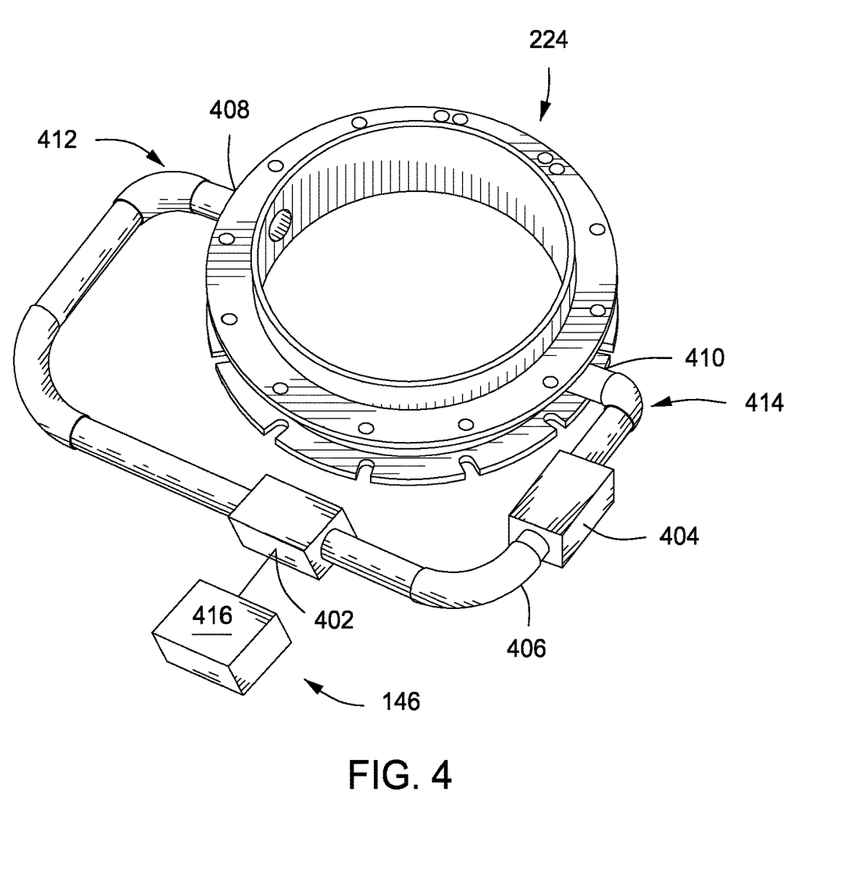
FIG. 4 depicts an apparatus for removing particles from a twin chamber processing system coupled to a component of a process chamber in accordance with some embodiments of the present invention.

Referring to FIG. 4, in some embodiments, the remote plasma system 146 may be configured to form the plasma within the conduit and circulate the plasma through the spool 224 (e.g., a toroidal plasma system). In such embodiments, the remote plasma system 146 may comprise a conduit 406 having a plasma source 402 (e.g., a power source and/or inductive coils) coupled to the conduit 406 inline along the conduit 406. In some embodiments, an optional DC break 404 may be coupled to the conduit 406. The DC break 404 may comprise an insulating material (e.g., a ceramic). When present, the DC break 404 may separate the conduit 406 into two separate sections and provide an vacuum tight insulative gap between the two separate sections of the conduit 406, thereby facilitating the suppression of induced currents through the conduit 406. A gas source 416 may be coupled to the plasma source 402 to provide one or more process gases to the plasma source 402. The conduit 406 has a first end 408 coupled to the spool 224 on a first side 412 of the spool and a second end 410 coupled to the spool 224 on a second side 414 of the spool 224, substantially opposite the first side 412. In operation, a process gas is provided to the plasma source 402 form the gas source 416. The plasma source 402 ignites the process gas to form the plasma, which then circulates through the conduit 406.

Figure 5:
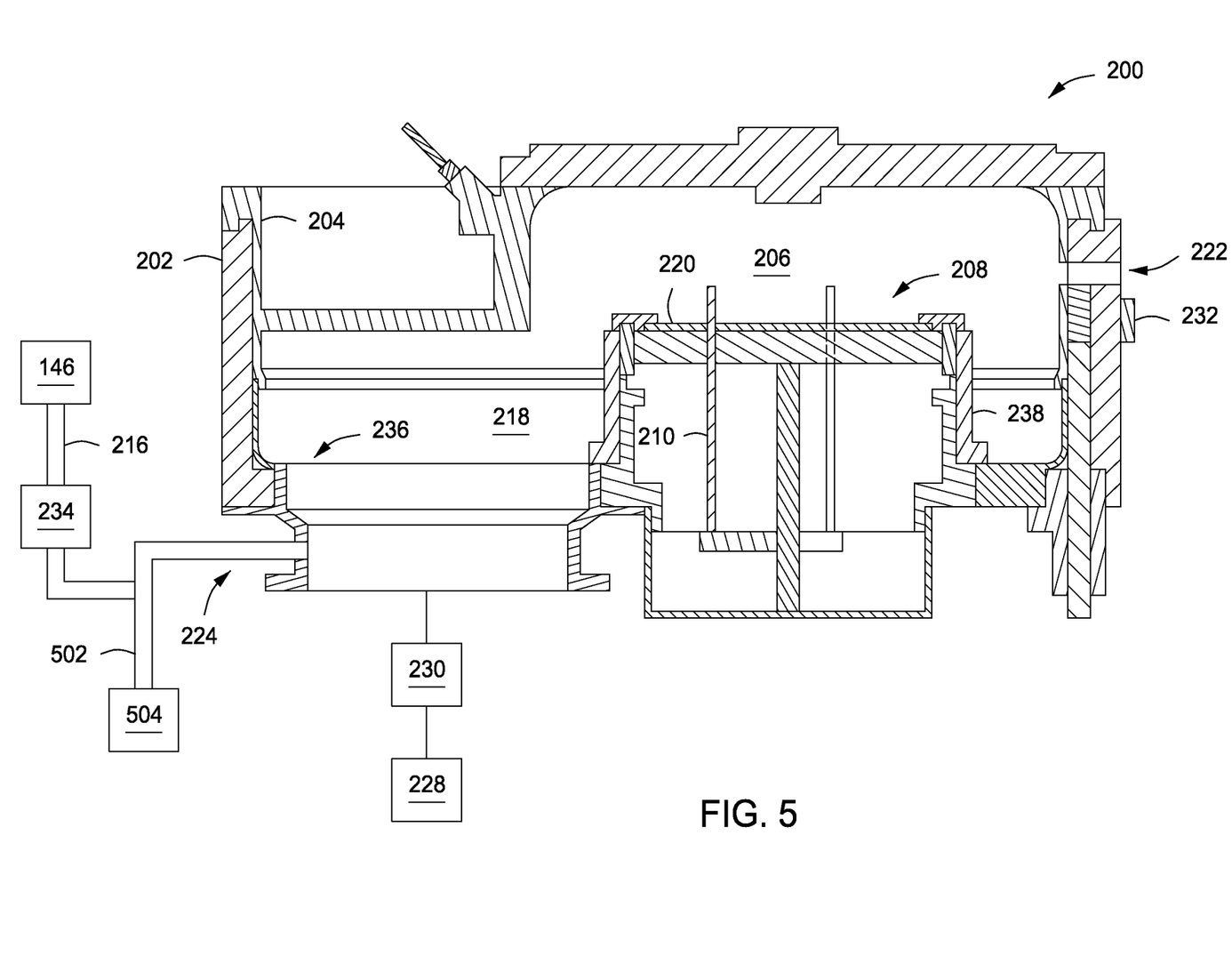
FIG. 5 depicts an apparatus for removing particles from a twin chamber processing system coupled to a process chamber in accordance with some embodiments of the present invention.

Referring to FIG. 5, in some embodiments, the remote plasma source 146 may be coupled to a foreline 502 coupled the process chamber 200. In such embodiments, the foreline 502 includes an outlet disposed in the spool 224 (e.g., along a boundary of the exhaust volume), such as shown in FIG. 5. In some embodiments, a vacuum pump 504 may be coupled to the foreline 502 to facilitate directing a flow of process gases and/or plasma through the foreline 502.

Figure 6:
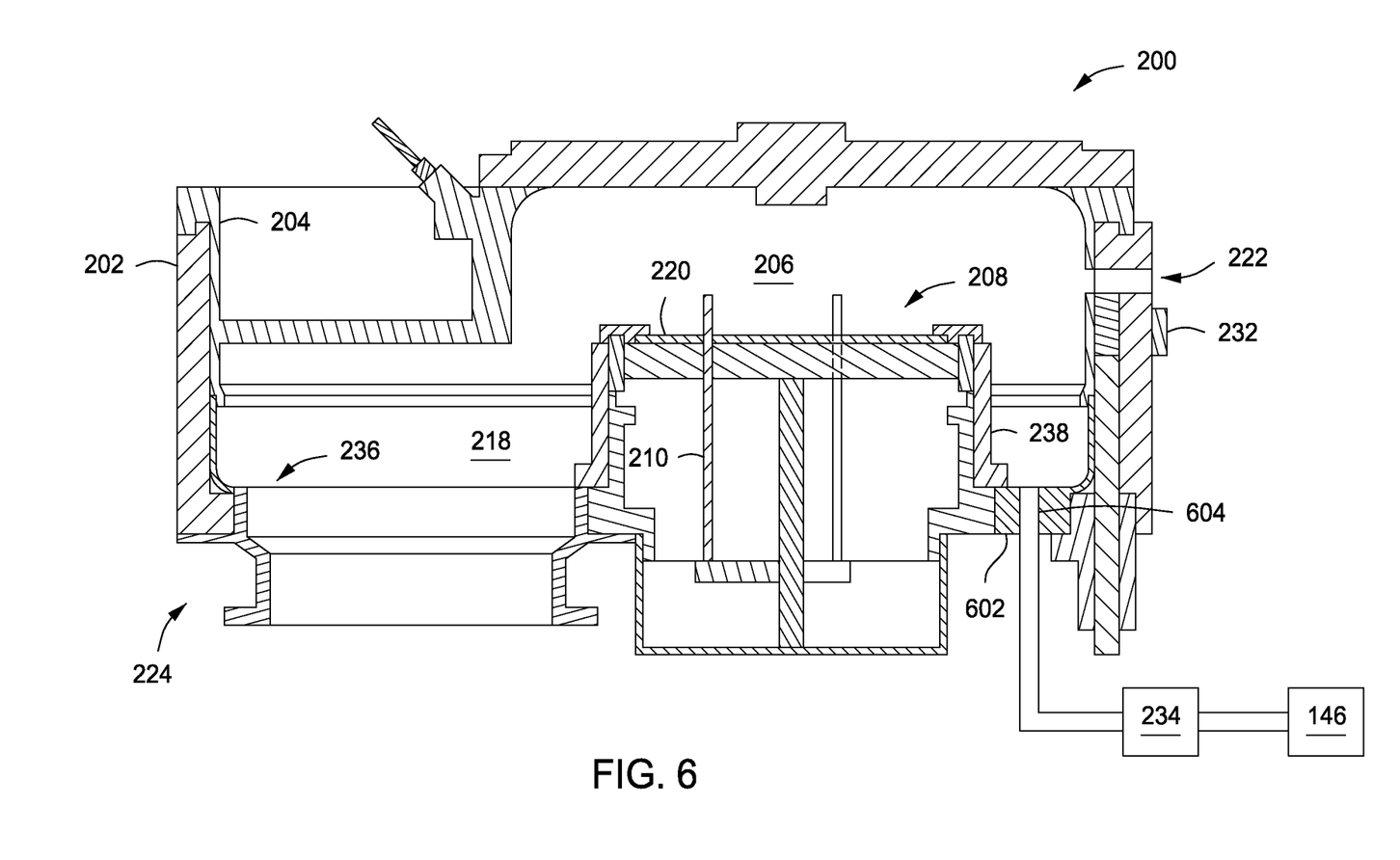
FIG. 6 depicts an apparatus for removing particles from a twin chamber processing system coupled to a component of a process chamber in accordance with some embodiments of the present invention.

Referring to FIG. 6, in some embodiments, the remote plasma system 146 may be coupled to the process chamber 200 via a through hole 604 formed in a bottom wall 602 of the process chamber 200 and having an outlet disposed adjacent to and fluidly coupled to the exhaust volume 218 (e.g., along a boundary of the exhaust volume). In such embodiments, the through hole 604 may be formed proximate the substrate support 208 and opposite the spool 224. Providing the through hole 604 in such a location allows the plasma provided by the remote plasma source 146 to flow across substantially the entire exhaust volume 218.

Figure 7:
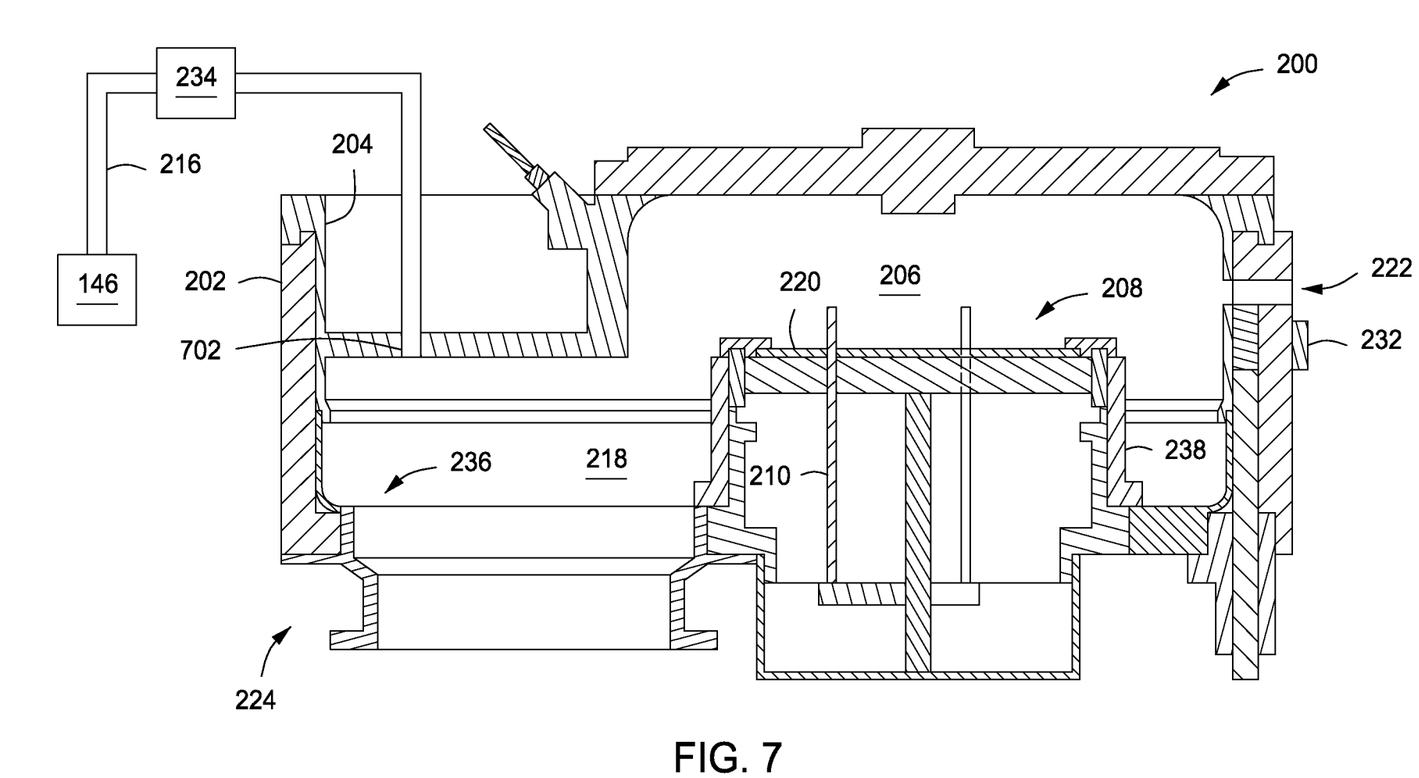
FIG. 7 depicts an apparatus for removing particles from a twin chamber processing system coupled to a process chamber in accordance with some embodiments of the present invention.
Figure 8:
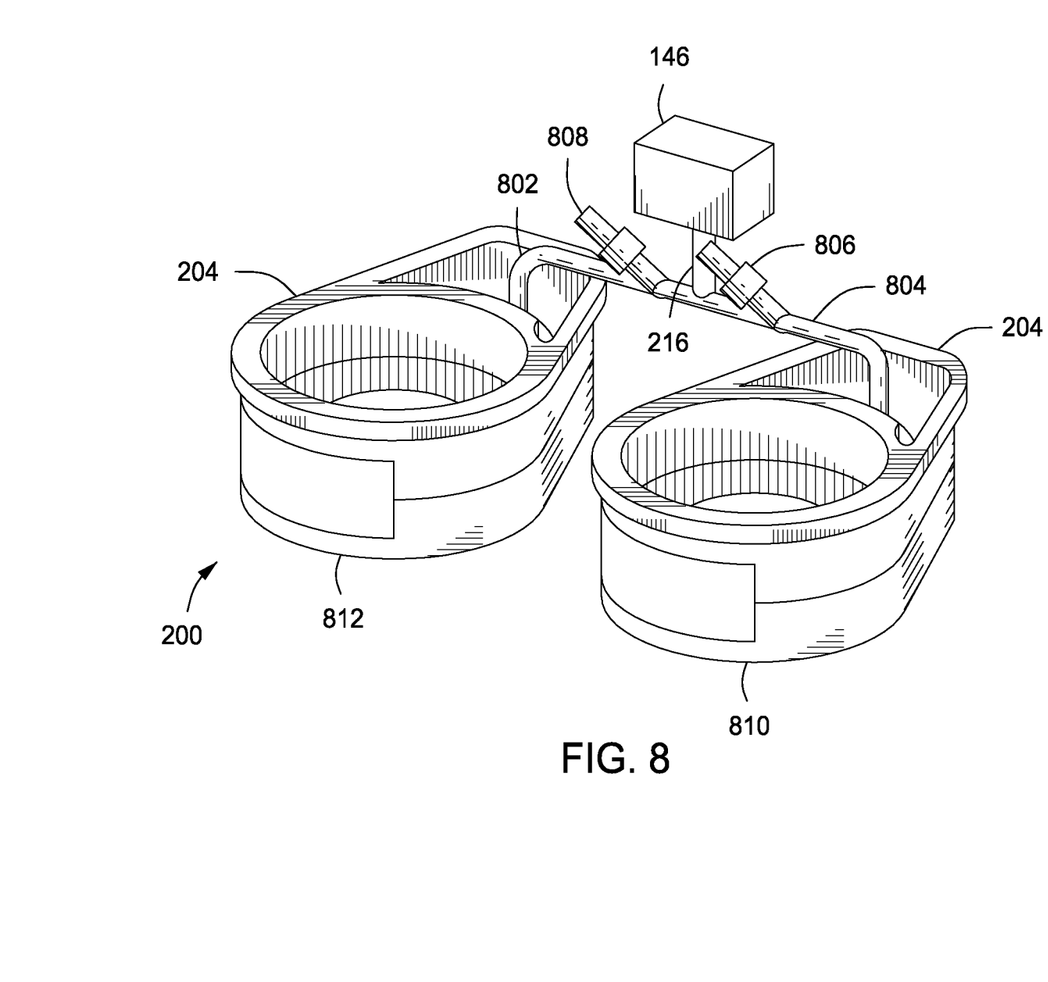
FIG. 8 depicts an apparatus for removing particles from a twin chamber processing system coupled to a component of a process chamber in accordance with some embodiments of the present invention.

Referring to FIG. 7, in some embodiments, the remote plasma source 146 may be coupled to the process chamber 200 via a through hole 702 formed in the upper liner 204 and having an outlet disposed adjacent to and fluidly coupled to the exhaust volume 218 (e.g., along a boundary of the exhaust volume). In some embodiments, for example where the remote plasma system 146 is shared between two process chambers 810, 812, the conduit 216 may be coupled to two separate conduits 802, 804 to allow the plasma to be provided to a through hole formed in an upper liner 204 of each process chamber 810, 812, for example, such as shown in FIG. 8. In such embodiments, a valve 806, 808 (e.g., a pneumatic straight through valve) may be coupled to each of the separate conduits 802, 804 to allow the plasma to be selectively provided to the process chambers. In some embodiments, each of the separate conduits 802, 804 may have substantially similar dimensions to provide an equal flow conductance through the conduits 802, 804 to each of the process chambers 810, 812.

Referring back to FIG. 1, in some embodiments, the factory interface 102 includes at least one docking station (one docking station 108 shown) and at least one factory interface robot (two factory interface robots 114 shown) to facilitate transfer of substrates. The docking station 108 is configured to accept one or more (two shown) front opening unified pods (FOUPs) 106A-B. In some embodiments, the factory interface robot 114 generally comprises a blade 116 disposed on one end of the factory interface robot 114 configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPs 106A-B.

The transfer chamber 136 has a vacuum robot 130 disposed therein. The vacuum robot 130 generally includes one or more transfer blades (two transfer blades shown 134) coupled to a movable arm 131. In some embodiments, for example where the processing chambers 110, 111, 112, 132, 128, 120 are arranged in groups of two as depicted FIG. 1, the vacuum robot 130 may have two parallel transfer blades 134 configured such that the vacuum robot 130 may simultaneously transfer two substrates 124 from the load lock chambers 122 to the processing chambers 110, 111, 112, 132, 128, 120.

The system controller 144 is coupled to the processing system 100. The system controller 144 may control the operation of the processing system 100 using a direct control of the process chambers 110, 111, 112, 132, 128, 120 of the processing system 100 or alternatively, by controlling the computers (or controllers) associated with the process chambers 110, 111, 112, 132, 128, 120 and the processing system 100. In operation, the system controller 144 enables data collection and feedback from the respective chambers and system controller 144 to optimize performance of the processing system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. To facilitate control of the processing system 100, the system controller 144 may be one of any form of general-purpose computer processor that can be used in an industrial setting for controlling various chambers and sub-processors. The memory, or computer-readable medium, 140 of the CPU 138 may be one or more of readily available memory such as random access memory (RAM), read only memory (ROM), floppy disk, hard disk, or any other form of digital storage, local or remote. The support circuits 142 are coupled to the CPU 138 for supporting the processor in a conventional manner. These circuits include cache, power supplies, clock circuits, input/output circuitry and subsystems, and the like.

One or more processes may generally be stored in the memory 140 as a software routine that, when executed by the CPU 138, causes the system controller 144 to perform processes of the present invention. The software routine may also be stored and/or executed by a second CPU (not shown) that is remotely located from the hardware being controlled by the CPU 138. Some or all of the methods of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 138, transforms the general purpose computer into a specific purpose computer (system controller) 144 that controls the chamber operation such that the one or more processes are performed.

Thus, an apparatus for removing particles from a twin chamber processing system has been provided herein. The inventive apparatus may advantageously facilitate removal of particles from a process chamber caused by, for example, mechanical contact of process chamber components, such as slit valves, throttle valves, lift pins, or the like.

While the foregoing is directed to embodiments of the present invention, other and further embodiments of the invention may be devised without departing from the basic scope thereof.

The invention claimed is:

1. An apparatus for removing particles from a twin chamber processing system, comprising:
    a plurality of process chambers;
    a remote plasma system;

a plurality of conduits fluidly coupling the remote plasma system to each process chamber of the plurality of process chambers of the twin chamber processing system to provide a plasma to an exhaust volume of each process chamber, wherein each conduit of the plurality of conduits has an outlet disposed along a boundary of the respective exhaust volumes, wherein each exhaust volume includes an exhaust port and a spool coupled to the exhaust port to couple the exhaust port to a vacuum pump, wherein each exhaust volume and each exhaust port are disposed below a substrate supporting surface of a substrate support disposed in each process chamber, and wherein the plurality of conduits comprises a conduit coupled to the spool of each process chamber, the conduit having a first end coupled to the spool on a first side of the spool and a second end coupled to the spool on a second side of the spool, opposite the first side; and wherein the remote plasma system comprises a plasma source coupled to the conduit inline along the conduit;

and a valve coupled to the vacuum pump and disposed between the spool and the vacuum pump.

2. The apparatus of claim 1, further comprising:
a valve coupled to each of the plurality of conduits to selectively provide plasma to each process chamber.

3. The apparatus of claim 1, wherein each process chamber comprises an upper liner disposed within a chamber body, wherein the upper liner defines a processing volume and the exhaust volume within each process chamber, and wherein each of the plurality of conduits are fluidly coupled to a through hole formed in the upper liner.

4. The apparatus of claim 1, wherein each process chamber comprises a through hole formed in a bottom wall of each process chamber, and wherein each of the plurality of conduits are fluidly coupled to the through hole formed in the bottom wall of each process chamber.

5. The apparatus of claim 1, wherein at east portions of the respective exhaust volumes are disposed between respective exhaust ports and substrate supports in each process chamber.

6. The apparatus of claim 1, further comprising a DC break coupled to the conduit to suppress induced currents through the conduit.

7. A twin chamber processing system, comprising:
a transfer chamber;
two process chambers coupled to the transfer chamber, the two process chambers having one or more shared resources;
a remote plasma system coupled to each of the two process chambers; and a plurality of conduits fluidly coupling the remote plasma system to each of the two process chambers to provide a plasma to an exhaust volume of each of the two process chambers, wherein each conduit of the plurality of conduits has an outlet disposed along a boundary of the respective exhaust volumes, wherein each exhaust volume includes an exhaust port and a spool coupled to the exhaust port to couple the exhaust port to a vacuum pump, wherein each exhaust volume and each exhaust port are disposed below a substrate supporting surface of a substrate support disposed in each process chamber, and wherein the plurality of conduits comprises a conduit coupled to the spool of each of the two process chambers, the conduit having a first end coupled to the spool on a first side of the spool and a second end coupled to the spool on a second side of the spool, opposite the first side; and wherein the remote plasma system comprises a plasma source coupled to the conduit inline along the conduit;

and a valve coupled to the vacuum pump and disposed between the spool and the vacuum pump.

8. The twin chamber processing system of claim 7, further comprising:
a valve coupled to each of the plurality of conduits to selectively provide plasma to each of the two process chambers.

9. The twin chamber processing system of claim 7, wherein each of the two process chambers comprises an upper liner disposed within a chamber body, wherein the upper liner defines a processing volume and the exhaust volume within each process chamber, and wherein each of the plurality of conduits are fluidly coupled to a through hole formed in the upper liner.

10. The twin chamber processing system of claim 7, wherein each of the two process chambers comprises a through hole formed in a bottom wall of each of the two process chambers, and wherein each of the plurality of conduits are fluidly coupled to the through hole formed in the bottom wall of each of the two process chambers.

11. The twin chamber processing system of claim 7, wherein at east portions of the respective exhaust volumes are disposed between respective exhaust ports and substrate supports in each process chamber.

12. The twin chamber processing system of claim 7, further comprising a DC break coupled to the conduit to suppress induced currents through the conduit.

* * * * *

UNITED STATES PATENT AND TRADEMARK OFFICE
CERTIFICATE OF CORRECTION

PATENT NO. : 10,672,591 B2
APPLICATION NO. : 13/962575
DATED : June 2, 2020
INVENTOR(S) : Andrew Nguyen et al.

It is certified that error appears in the above-identified patent and that said Letters Patent is hereby corrected as shown below:

In the Claims

Column 10, Line 43 in Claim 11, delete "east" and substitute therefore "least".

Signed and Sealed this
Twenty-first Day of July, 2020

Andrei Iancu
*Director of the United States Patent and Trademark Office*